United States Patent
Kuo et al.

(10) Patent No.: US 12,414,235 B2
(45) Date of Patent: Sep. 9, 2025

(54) CIRCUIT BOARD STRUCTURE AND MANUFACTURING METHOD THEREOF

(71) Applicant: UNIMICRON TECHNOLOGY CORP., Taoyuan (TW)

(72) Inventors: Chun Hung Kuo, Taoyuan (TW); Kuo-Ching Chen, Taoyuan (TW); Yu-Cheng Huang, Taoyuan (TW); Yu-Hua Chen, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 211 days.

(21) Appl. No.: 18/220,548

(22) Filed: Jul. 11, 2023

(65) Prior Publication Data

US 2024/0389232 A1 Nov. 21, 2024

(30) Foreign Application Priority Data

May 19, 2023 (TW) ................... 112118639

(51) Int. Cl.
*H05K 1/14* (2006.01)
*H05K 1/16* (2006.01)
*H05K 3/36* (2006.01)

(52) U.S. Cl.
CPC ............ *H05K 1/142* (2013.01); *H05K 1/165* (2013.01); *H05K 3/368* (2013.01); *H05K 2201/086* (2013.01); *H05K 2201/10265* (2013.01)

(58) Field of Classification Search
CPC ... H05K 2201/086; H05K 2201/10265; H05K 3/368; H05K 1/165; H05K 1/142; H05K 1/14

See application file for complete search history.

(56) References Cited

U.S. PATENT DOCUMENTS

| | | | |
|---|---|---|---|
| 8,325,002 B2 | 12/2012 | Lim et al. | |
| 9,781,834 B1* | 10/2017 | Sturcken | H05K 1/0233 |
| 10,892,230 B2 | 1/2021 | Lu et al. | |
| 11,158,444 B2 | 10/2021 | Marin et al. | |
| 11,387,198 B2* | 7/2022 | Gomes | H01L 25/0657 |
| 2024/0097303 A1* | 3/2024 | Liu | H01P 1/36 |

FOREIGN PATENT DOCUMENTS

| | | |
|---|---|---|
| CN | 106010124 A | 10/2016 |
| TW | 201142879 A | 12/2011 |
| TW | I710092 B | 11/2020 |

* cited by examiner

*Primary Examiner* — Timothy J Thompson
*Assistant Examiner* — Amol H Patel
(74) *Attorney, Agent, or Firm* — Maschoff Brennan

(57) ABSTRACT

A circuit board structure and a manufacturing method thereof. Circuit board structure includes first circuit board, second circuit board, conductive coil, magnetic body and molding compound. First circuit board has first side surface and first cavity located on first side surface. Second circuit board has second side surface facing first side surface and being spaced apart from first side surface. Conductive coil is in a spiral shape and includes first coil pattern and second coil pattern. First coil pattern is disposed in first circuit board. Second coil pattern is disposed in second circuit board. First coil pattern is electrically connected to second coil pattern. Magnetic body is filled in first cavity of first circuit board. Conductive coil surrounds at least a part of magnetic body. Molding compound is filled in a gap between first side surface and second side surface.

10 Claims, 20 Drawing Sheets

CIRCUIT BOARD STRUCTURE AND MANUFACTURING METHOD THEREOF

CROSS-REFERENCE TO RELATED APPLICATIONS

This non-provisional application claims priority under 35 U.S.C. § 119(a) on Patent Application No(s). 112118639 filed in Taiwan, R.O.C. on May 19, 2023, the entire contents of which are hereby incorporated by reference.

TECHNICAL FIELD

The disclosure relates to a circuit board structure and a manufacturing method thereof, more particularly to a circuit board structure including at least one conductive coil and at least one magnetic body and a manufacturing method thereof.

BACKGROUND

An inductor, a passive component in electronics, has multiple functions of, for example, filtering noise, suppressing momentary current, preventing interference caused by electromagnetic wave, shielding electromagnetic radiation, reducing electromagnetic interference and converting power. Thus, there is usually at least one inductor disposed in a circuit board.

In general, in order to configure an inductor, an entire of a conductive coil is formed in a single circuit board. However, the entire of the conductive coil occupies significant amount of space in the circuit board, which is unfavorable for the space utilization and the miniaturization of the circuit board.

SUMMARY

The disclosure provides a circuit board structure and a manufacturing method thereof to improve the space utilization of the circuit board and facilitate the miniaturization of the circuit board.

One embodiment of this disclosure provides a circuit board structure including a first circuit board, a second circuit board, a conductive coil, a first magnetic body and a molding compound. The first circuit board has a first side surface and a first cavity located on the first side surface. The second circuit board has a second side surface facing the first side surface and being spaced apart from the first side surface. The conductive coil is in a spiral shape and includes a first coil pattern and a second coil pattern. The first coil pattern is disposed in the first circuit board. The second coil pattern is disposed in the second circuit board. The first coil pattern is electrically connected to the second coil pattern. The first magnetic body is filled in the first cavity of the first circuit board. The conductive coil surrounds at least a part of the first magnetic body. The molding compound is filled in a gap between the first side surface and the second side surface.

In an embodiment of the disclosure, the circuit board structure further includes a second magnetic body. The second circuit board further has a second cavity. The second cavity is located on the second side surface. The second magnetic body is filled in the second cavity. The conductive coil surrounds at least a part of the second magnetic body.

In an embodiment of the disclosure, the circuit board structure further includes a first chip and a second chip. The first chip is disposed on the first circuit board. The second chip is disposed on the second circuit board.

In an embodiment of the disclosure, a size of the first circuit board is larger than a size of the second circuit board.

In an embodiment of the disclosure, the molding compound is magnetic.

In an embodiment of the disclosure, an inductance formed by the conductive coil and the first magnetic body is proportional to an effective cross-sectional area of the first magnetic body.

Another embodiment of this disclosure provides a manufacturing method of a circuit board structure including forming a first coil pattern of a conductive coil and a first magnetic body in a first circuit board; forming a second coil pattern of the conductive coil in a second circuit board; electrically connecting the first coil pattern to the second coil pattern; and filling a molding compound in a gap between the first side surface and a second side surface of the second circuit board. The conductive coil surrounds at least a part of the first magnetic body.

In an embodiment of the disclosure, the forming the first coil pattern and the first magnetic body in the first circuit board comprises forming an inner circuit pattern in a circuit substrate; forming a first cavity in the circuit substrate; filling a magnetic material in the first cavity; forming an outer circuit pattern in the circuit substrate; and cutting a part of the circuit substrate to form the first circuit board and allow the first cavity to be located on a first side surface of the first circuit board, cutting a part of the inner circuit pattern and a part of the outer circuit pattern to form the first coil pattern, and cutting a part of the magnetic material to form the first magnetic body.

In an embodiment of the disclosure, the manufacturing method of the circuit board structure further includes forming a second magnetic body in the second circuit board before electrically connecting the first coil pattern to the second coil pattern. The conductive coil surrounds at least a part of the second magnetic body.

In an embodiment of the disclosure, the manufacturing method of the circuit board structure further includes disposing a first chip on the first circuit board and disposing a second chip on the second circuit board.

According to the circuit board structure and the manufacturing method thereof disclosed by above embodiments, the conductive coil is in a spiral shape and includes the first coil pattern disposed in the first circuit board and the second coil pattern disposed in the second circuit board. That is, the present disclosure respectively forms multiple coil patterns in multiple circuit boards to configure the conductive coil, thereby preventing the conductive coil from occupying significant amount of space in a single circuit board. Accordingly, the space utilization of each of the first circuit board and the second circuit board is improved, and the miniaturization of each of the first circuit board and the second circuit board is facilitated.

Further, the conductive coil surrounds at least a part of the first magnetic body. Thus, the first magnetic body can enhance the inductance effect generated by the conductive coil. Also, the first magnetic body is filled in the first cavity located on the first side surface. Thus, the first magnetic body can have large filling volume and large effective cross-sectional area, and the conductive coil can have more turns, thereby further enhancing the inductance effect generated by the conductive coil.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
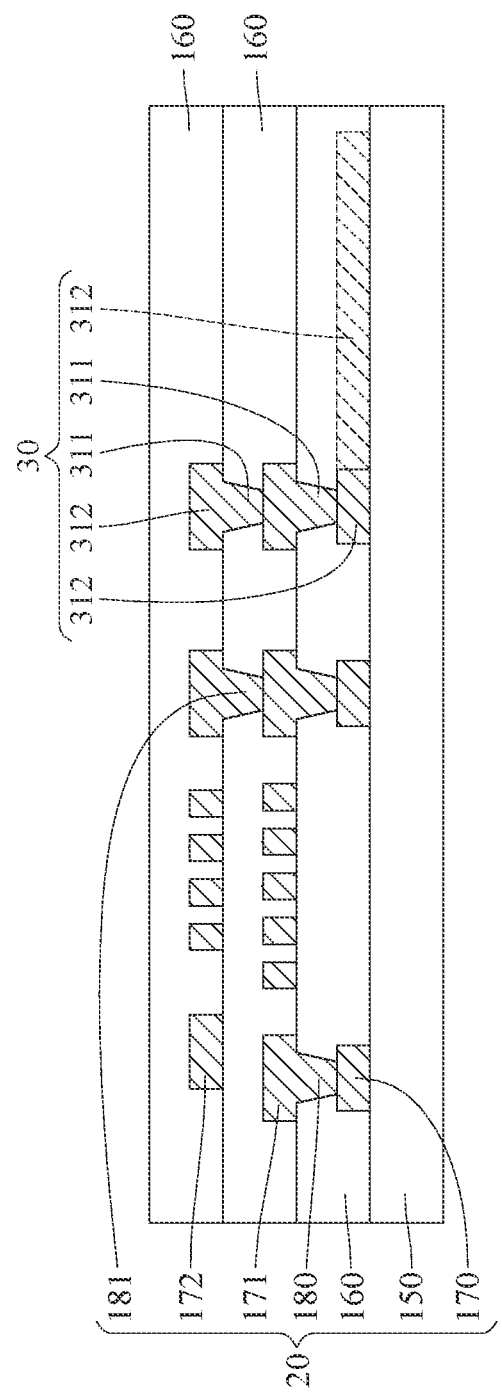
FIGS. 1 to 7 are side cross-sectional views of a manufacturing method of a circuit board structure according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIGS. 1 to 7. FIGS. 1 to 7 are side cross-sectional views of a manufacturing method of a circuit board structure 10 according to a first embodiment of the disclosure. The manufacture method of the circuit board structure 10 according to this embodiment may include the following steps.

Please refer to FIG. 1, an inner circuit pattern 30 is formed in the circuit substrate 20. The circuit substrate 20 includes a substrate 150, dielectric layers 160, wiring layers 170, 171 and 172 and conductive blind vias 180 and 181. The dielectric layers 160 are disposed on the substrate 150. The wiring layers 170, 171 and 172 are disposed on the dielectric layers 160 or the substrate 150, respectively. The conductive blind vias 180 and 181 are located in the dielectric layers 160, respectively. The inner circuit pattern 30 includes vertical portions 311 and horizontal portions 312. The vertical portions 311 of the inner circuit pattern 30 are formed together with the conductive blind vias 180 and 181 in the dielectric layers 160. The horizontal portions 312 of the inner circuit pattern 30 are formed together with the wiring layers 170, 171 and 172 on the dielectric layers 160 or the substrate 150.

Figure 2:
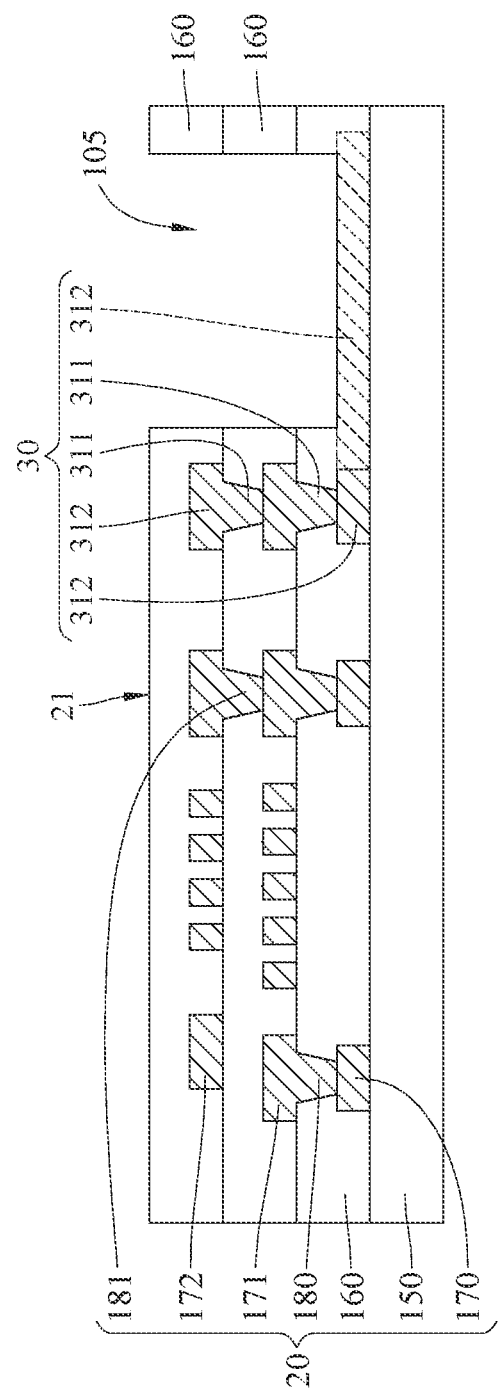

Please refer to FIG. 2, a first cavity 105 is formed in the circuit substrate 20. The first cavity 105 is located on a top surface 21 of the circuit substrate 20. Further, the first cavity 105 exposes a part of one of the horizontal portions 312 of the inner circuit pattern 30. In this embodiment, the first cavity 105 passes through, for example, three dielectric layers 160, but the disclosure is not limited thereto. In other embodiments, the first cavity may pass through one, two or at least four dielectric layers.

Figure 3:
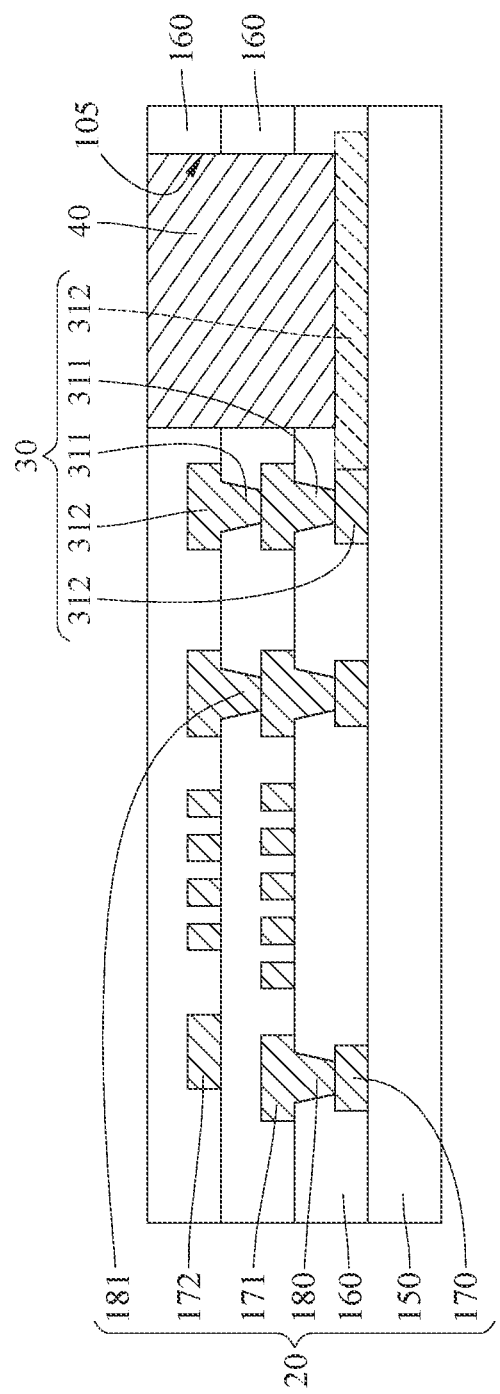

Please refer to FIG. 3, a magnetic material 40 is filled in the first cavity 105.

Figure 4:
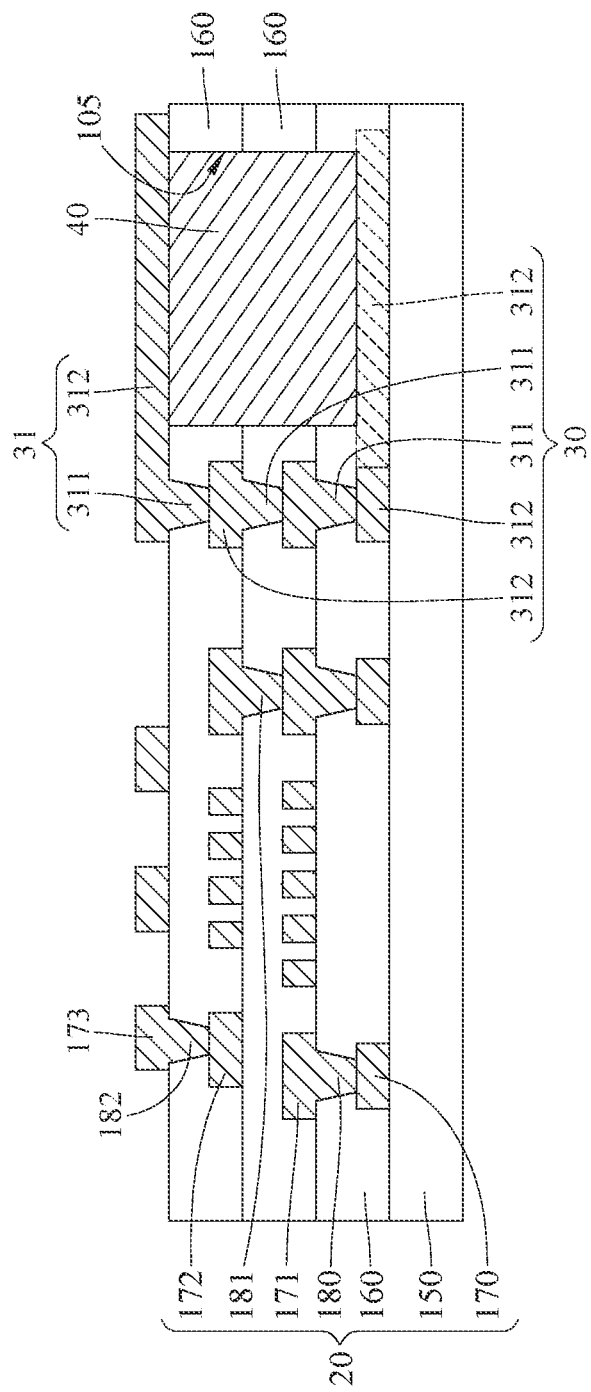

Please refer to FIG. 4, an outer circuit pattern 31 is formed in the circuit substrate 20, bonding pads 173 are formed on the dielectric layers 160, and a conductive blind via 182 is formed in the dielectric layer 160. The outer circuit pattern 31 includes vertical portions 311 and horizontal portions 312. The vertical portions 311 of the outer circuit pattern 31 are formed together with the conductive blind via 182 in the dielectric layer 160. The horizontal portions 312 of the outer circuit pattern 31 are formed together with the bonding pads 173 on the dielectric layers 160.

Figure 5:
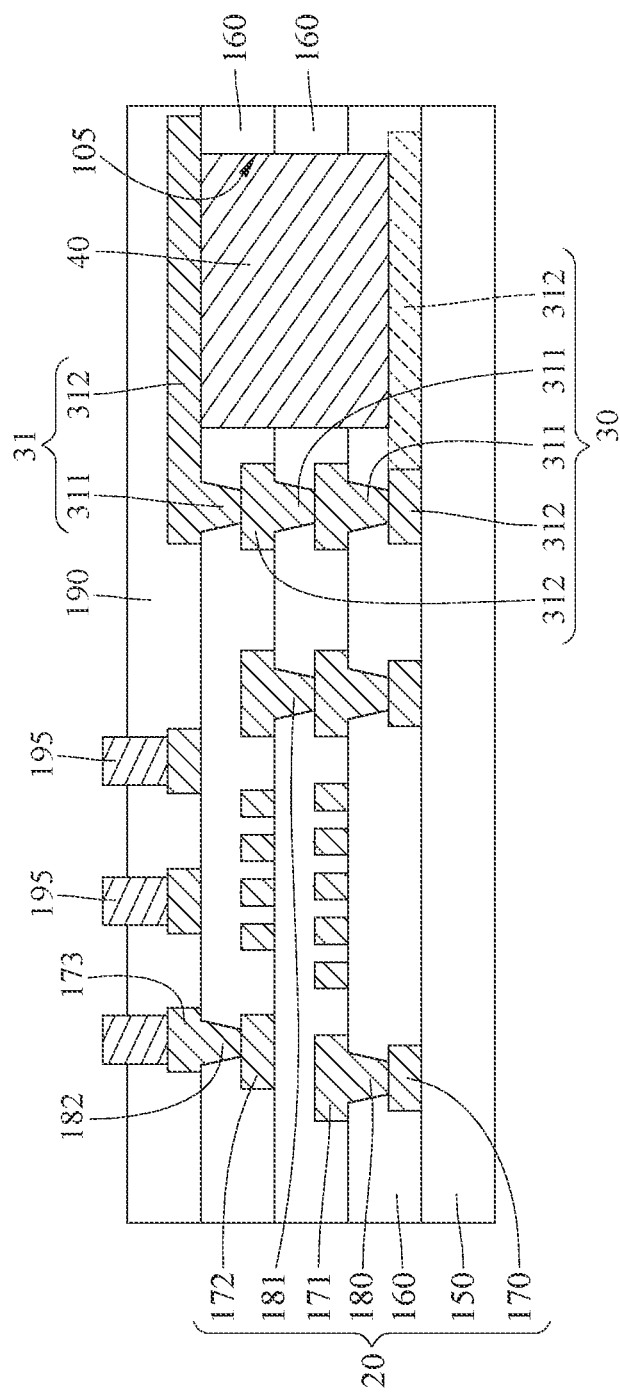

Please refer to FIG. 5, an insulating material layer 190 is formed on the dielectric layers 160, and conductive bumps 195 are formed on the bonding pads 173.

Figure 6:
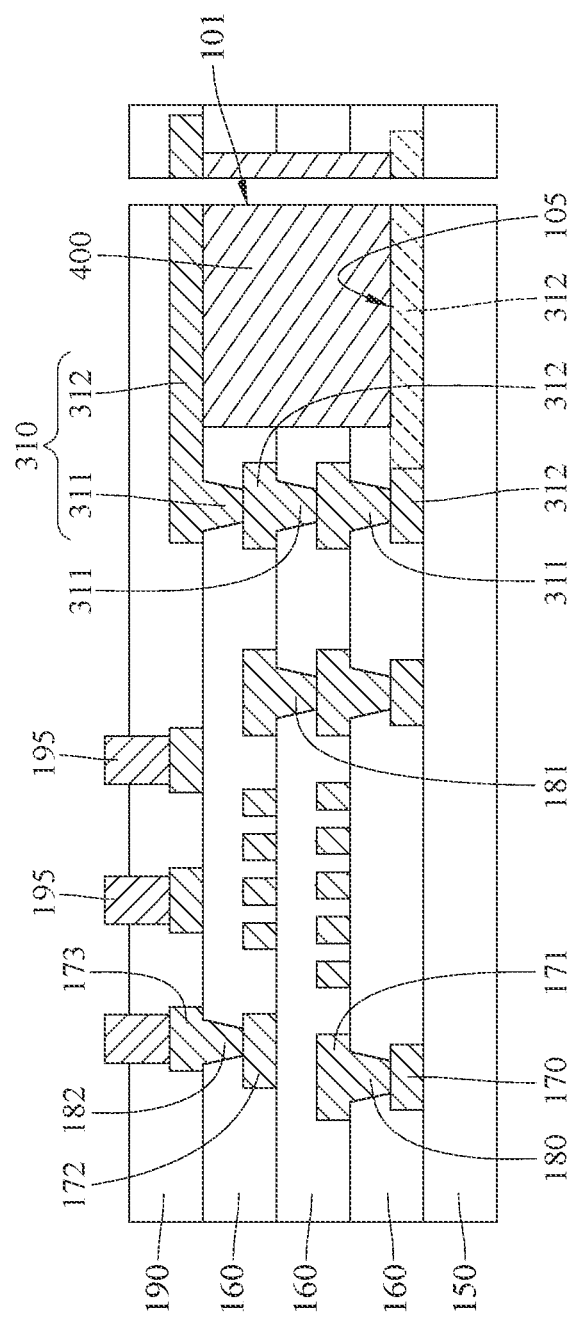

Please refer to FIGS. 5 and 6, a part of the circuit substrate 20 is cut to form a first circuit board 100 and to allow the first cavity 105 to be located on a first side surface 101 of the first circuit board 100. Also, a part of the inner circuit pattern 30 and a part of the outer circuit pattern 31 are cut to from a first coil pattern 310, and a part of the magnetic material 40 is cut to form a first magnetic body 400. A step of forming the first coil pattern 310 and the first magnetic body 400 in the first circuit board 100 is completed so far. The first coil pattern 310 includes the vertical portions 311 and the horizontal portions 312.

Figure 7:
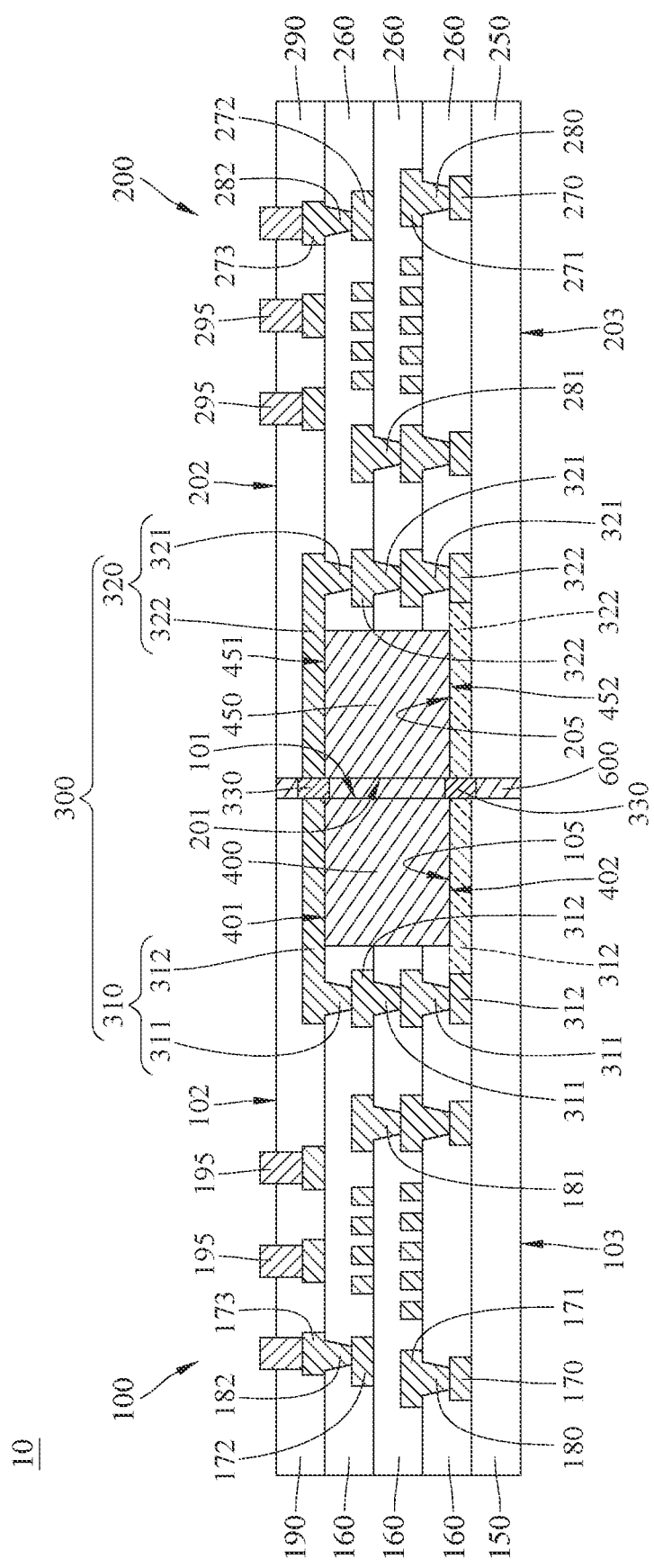

Please refer to FIG. 7, a second coil pattern 320 of a conductive coil 300 is formed in a second circuit board 200, and a second magnetic body 450 is formed in the second circuit board 200. The step of forming the second coil pattern 320 of the conductive coil 300 in the second circuit board 200 and the step of forming the second magnetic body 450 in the second circuit board 200 may be simultaneously performed in a manner similar to the step of forming the first coil pattern 310 and the first magnetic body 400 in the first circuit board 100.

The second circuit board 200 has a second side surface 201 and a second cavity 205. The second cavity 205 is located on the second side surface 201. The second side surface 201 faces the first side surface 101, and is spaced apart from the first side surface 101. The second circuit board 200 includes a substrate 250, dielectric layers 260, wiring layers 270, 271 and 272, bonding pads 273, conductive blind vias 280, 281 and 282, an insulating material layer 290 and conductive bumps 295.

The dielectric layers 260 are disposed on the substrate 250. The wiring layers 270, 271 and 272 and the bonding pads 273 are disposed on the dielectric layers 260, respectively. The conductive blind vias 280, 281 and 282 are located in the dielectric layers 260, respectively. The insulating material layer 290 is located on the dielectric layers 260. The conductive bumps 295 are located on the bonding pads 273, respectively. The second coil pattern 320 includes vertical portions 321 and horizontal portions 322. The vertical portions 321 are formed together with the conductive blind vias 280, 281 and 282 in the dielectric layers 260, respectively. The horizontal portions 322 are formed together with the wiring layers 270, 271 and 272 and the bonding pads 273 on the dielectric layers 260 or the substrate 250. The second magnetic body 450 is filled in the second cavity 205.

In addition, the first coil pattern 310 is electrically connected to the second coil pattern 320 via, for example, solder pads 330.

In addition, a molding compound 600 is filled in a gap between the first side surface 101 and the second side surface 201. Manufacturing of the circuit board structure 10 is completed so far.

In this embodiment, the molding compound 600 is, for example, magnetic, but the disclosure is not limited thereto. In other embodiments, the molding compound may not be magnetic.

Note that in this embodiment, an insulating frame part (i.e., the part of the circuit substrate 20, the part of the inner circuit pattern 30, the part of the outer circuit pattern 31 and the part of the magnetic material 40 that are cut in FIG. 6) excluding the first circuit board 100 is cut before performing the packaging process using the molding compound 600 in FIG. 7. Thus, the available space for the wirings in the resulting first circuit board 100 is prevented from being reduced by the cutting step in FIG. 6.

Note that the disclosure is not limited by the order of the steps shown in FIGS. 1 to 7. For example, in this embodiment, the first coil pattern 310 and the first magnetic body 400 are formed in the first circuit board 100 before the second coil pattern and the second magnetic body are formed in the second circuit board, but the disclosure is not limited thereto. In other embodiments, in the same step, the first coil pattern and the first magnetic body may be formed in the first circuit board while the second coil pattern and the second magnetic body are formed in the second circuit board.

Figure 8:
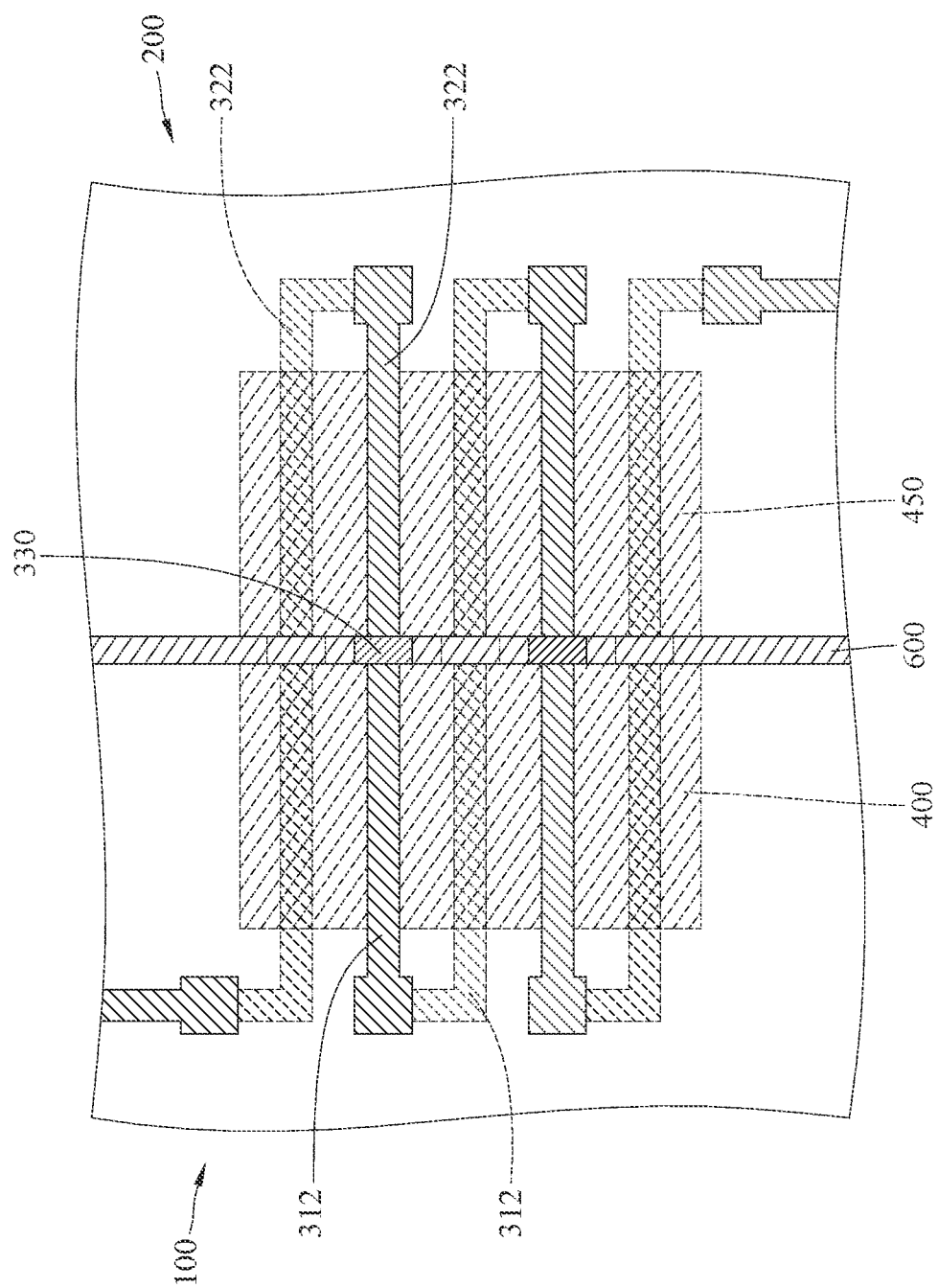
FIG. 8 is a top view of the circuit board structure in FIG. 7.
Figure 9:
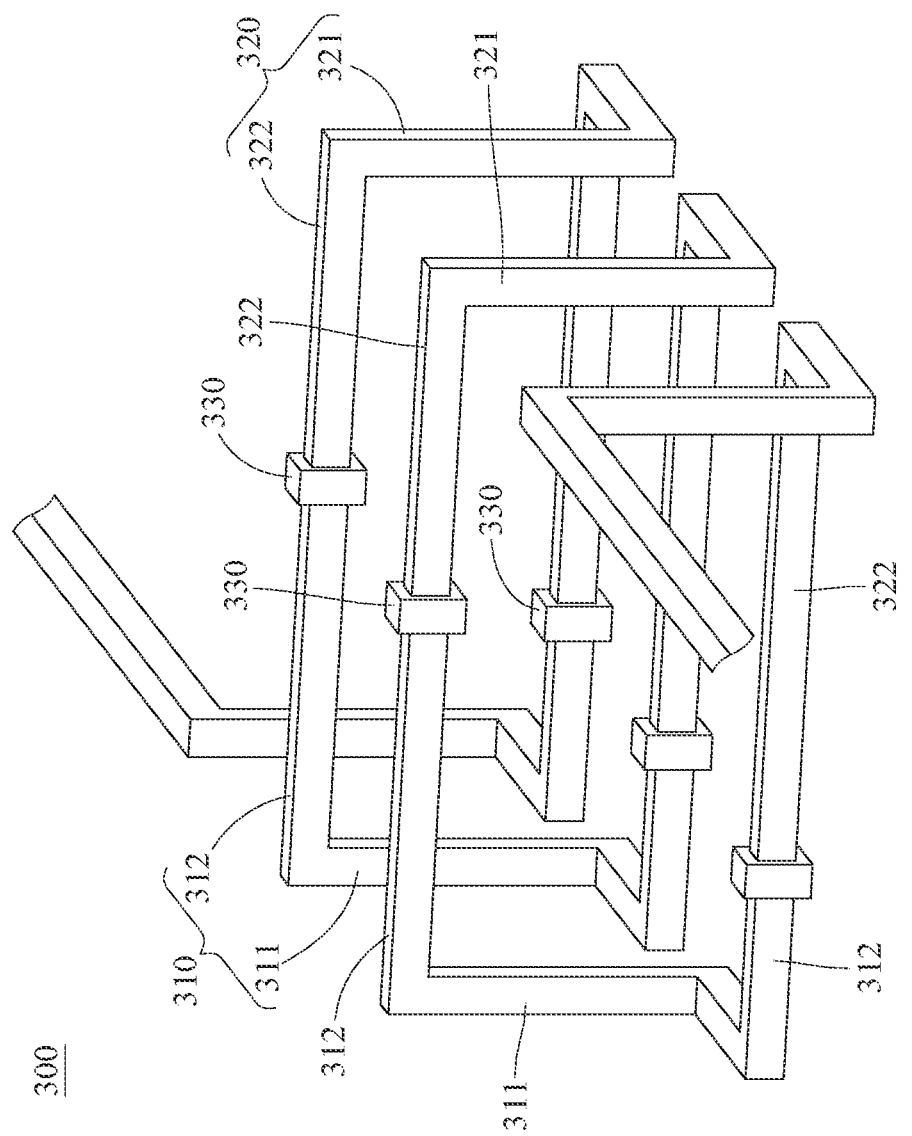
FIG. 9 is a perspective view of a conductive coil of the circuit board structure in FIG. 7.

Please refer to FIGS. 8 and 9. FIG. 8 is a top view of the circuit board structure 10 in FIG. 7. FIG. 9 is a perspective view of the conductive coil 300 of the circuit board structure 10 in FIG. 7. In this embodiment, the conductive coil 300 is in a spiral shape and includes the first coil pattern 310, the second coil pattern 320 and solder pads 330. Furthermore, the conductive coil 300 surrounds at least a part of the first magnetic body 400 and at least a part of the second magnetic body 450. In addition, in order to illustrate the spiral shape of the conductive coil 300, FIG. 9 shows the conductive coil 300 with simplified shape. In practical, the vertical portions 311 of the first coil pattern 310 and the vertical portions 321 of the second coil pattern 320 in FIG. 9 may be similar to the conductive blind vias 180, 181, 182, 280, 281 and 282 in shape. Also, the horizontal portions 312 of the first coil pattern 310 and the horizontal portions 322 of the second coil pattern 320 in FIG. 9 may be similar to the wiring layers 170, 171, 172, 270, 271 and 272 or the bonding pads 173 and 273 in shape. As shown in FIG. 9, the conductive coil 300 has, for example, two and a half turns, but the disclosure is not limited thereto. In other embodiments, the conductive coil may merely have a single turn.

In addition, the disclosure is not limited by the arranging direction of the turns of the conductive coil 300. In other embodiments, as long as the conductive coil surrounds at least a part of the first molding compound, the turns of the conductive coil are allowed to be arranged along an arbitrary direction.

In this disclosure, the first coil pattern 310 and the second coil pattern 320 are respectively formed in the first circuit board 100 and the second circuit board 200 to configure the conductive coil 300. Thus, the space of the first circuit board 100 or the second circuit board 200 occupied by the conductive coil 300 is reduced. In this way, the space utilization of each of the first circuit board 100 and the second circuit board 200 is improved, and the miniaturization of each of the first circuit board 100 and the second circuit board 200 is facilitated.

Further, the conductive coil 300 surrounds at least a part of the first magnetic body 400. Thus, the first magnetic body 400 can enhance the inductance effect generated by the conductive coil 300. Also, the first magnetic body 400 is filled in the first cavity 105 located on the first side surface 101. Thus, the first magnetic body 400 can have large filling volume (i.e., the volume of a part of the first magnetic body 400 that is filled in the first cavity 105) and large effective cross-sectional area, and the conductive coil can have more turns, thereby further enhancing the inductance effect generated by the conductive coil 300.

Additionally, the inductance effect generated by the conductive coil 300, the first magnetic body 400 and the second magnetic body 450 depends on the filling volumes of the first magnetic body 400 and the second magnetic body 450 and the turns of the conductive coil 300. Specifically, if the filling volumes of the first magnetic body 400 and the second magnetic body 450 or the turns of the conductive coil 300 increases, the generated inductance effect will be increased; in contrast, if the filling volumes of the first magnetic body 400 and the second magnetic body 450 or the turns of the conductive coil 300 decreases, the generated inductance effect will be decreased.

In this embodiment, the inductance effect generated by the conductive coil 300 and the first magnetic body 400 is proportional to the effective cross-sectional area of the first magnetic body 400. In detail, the inductance formed by the conductive coil 300 and the first magnetic body 400 can be obtained by, for example, the following formula:

$$L = \frac{N^2 \mu A_e}{l_e}$$

In the above formula, L denotes the inductance formed by the conductive coil 300 and the first magnetic body 400; N denotes a number of the turn(s) of the conductive coil 300; $\mu$ denotes permeability; $A_e$ denotes an effective cross-sectional area of the first magnetic body 400, where the effective cross-sectional area may be regarded as the contact area or the area of the orthogonal projection between the conductive coil 300 and the first magnetic body 400, and in this embodiment, the effective cross-sectional area is, for example, the contact area between the conductive coil 300 and the first magnetic body 400; $l_e$ denotes an effective magnetic path length of the first magnetic body 400. According to the above formula, if the filling area of the first magnetic body 400 increases, not only the effective cross-sectional area $A_e$ is increased, but also the conductive coil 300 may have more turns, thereby enhancing the inductance formed by the conductive coil 300 and the first magnetic body 400. Note that the inductance is formed by the conductive coil 300 and the second magnetic body 450 based on a similar principle, and thus the repeated descriptions are omitted.

In this embodiment, the filling volume of the first magnetic body 400 is the same as the filling volume of the second magnetic body 450, but the disclosure is not limited thereto. In other embodiments, the filling volume of the first magnetic body may be different from the filling volume of the second magnetic body. Correspondingly, the size of the first cavity 105 and the size of the second cavity 205 may be designed based on actual requirements of the filling volume of the first magnetic body 400 and the filling volume of the second magnetic body 450.

In this embodiment, as shown in FIG. 7, a top surface 401 and a bottom surface 402 of the first magnetic body 400 are flush with a top surface 451 and a bottom surface 452 of the second magnetic body 450, respectively, but the disclosure is not limited thereto. In other embodiments, the top surface and the bottom surface of the first magnetic body may be misaligned with (i.e., may not be flushed with) the top surface and the bottom surface of the second magnetic body, respectively.

In this embodiment, the molding compound 600 is filled in the gap between the first side surface 101 and the second side surface 201. That is, as shown in FIG. 7, a top surface 102 or a top surface 202 of one of the first circuit board 100 and the second circuit board 200 is not located lower than a bottom surface 103 or a bottom surface 203 of the other of the first circuit board 100 and the second circuit board 200. Similarly, the bottom surface 103 or the bottom surface 203 of one of the first circuit board 100 and the second circuit board 200 is not located higher than the top surface 102 or the top surface 202 of the other of the first circuit board 100 and the second circuit board 200. With such configuration, at least a part of the first side surface 101 of the first circuit board 100 faces the second side surface 201 of the second circuit board 200, and thus the gap for the molding compound 600 to be filled therein is formed.

Note that in other embodiments, the first circuit board and the second circuit board may be disposed on a third circuit board to configure a circuit board structure including three circuit boards. Alternatively, in other embodiments, the first circuit board and the second circuit board may be disposed on a third circuit board, and a fourth circuit board may be disposed on the first circuit board and the second circuit board to configure a circuit board structure including four circuit boards.

In this embodiment, the first magnetic body 400 and the second magnetic body 450 are respectively filled in the first circuit board 100 and the second circuit board 200, and the first circuit board 100 and the second circuit board 200 have the same size. However, the disclosure is not limited thereto.

Other embodiments are described below for illustrative purposes. It is to be noted that the following embodiments use the reference numerals and a part of the contents of the above embodiments, the same reference numerals are used to denote the same or similar elements, and the description of the same technical contents is omitted. For the description of the omitted part, reference may be made to the above embodiments, and details are not described in the following embodiments.

Figure 10:
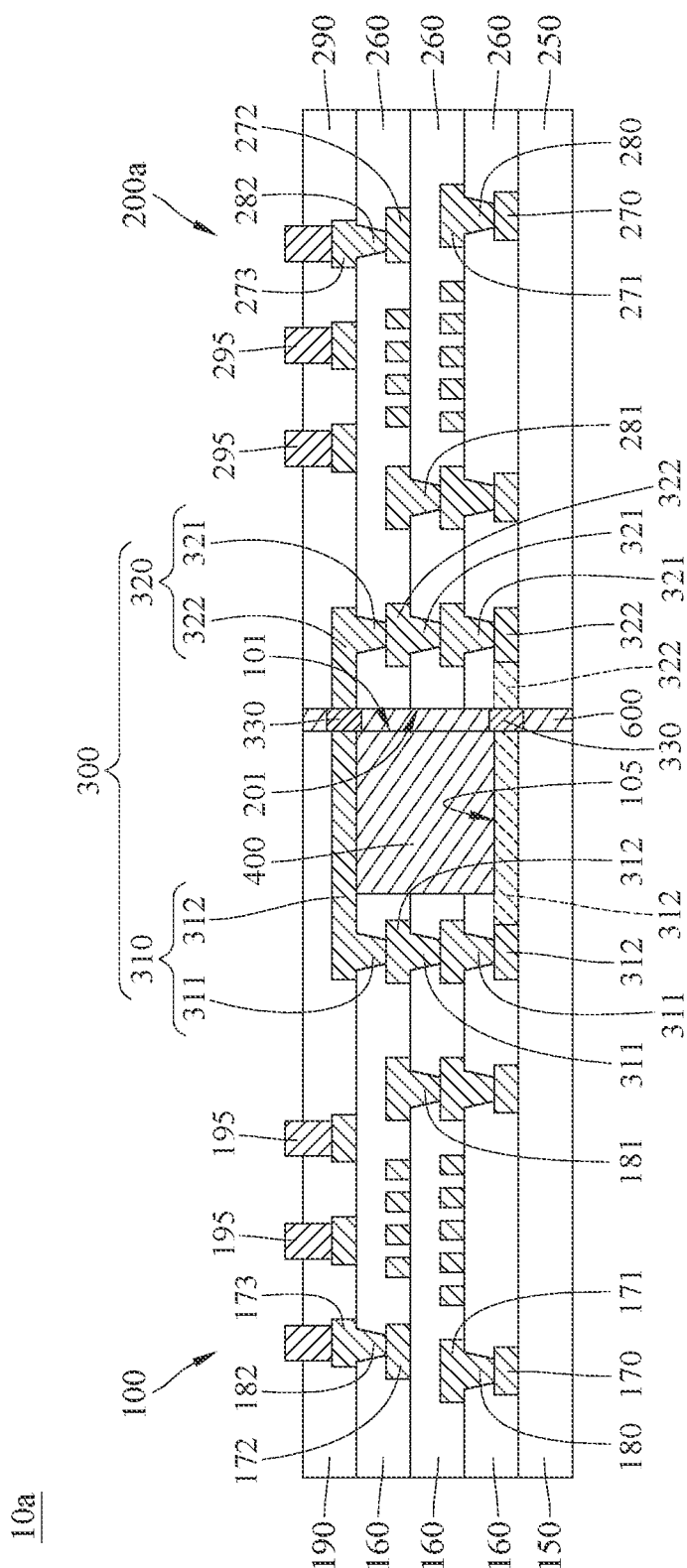
FIG. 10 is a side cross-sectional view of a circuit board structure according to a second embodiment of the disclosure.

Please refer to FIG. 10. FIG. 10 is a side cross-sectional view of a circuit board structure 10a according to a second embodiment of the disclosure. Hereinafter, only the different between the circuit board structure 10a of this embodiment and the circuit board structure 10 of the first embodiment will be described, and other similar or identical descriptions are omitted. In this embodiment, a second circuit board 200a of the circuit board structure 10a does not have the second cavity 205 in the first embodiment, and no magnetic body (e.g. second magnetic body 450 in the first embodiment) is filled in the second circuit board 200a. Moreover, a size of the first circuit board 100 is larger than a size of the second circuit board 200a. However, the disclosure is not limited thereto.

Figure 11:
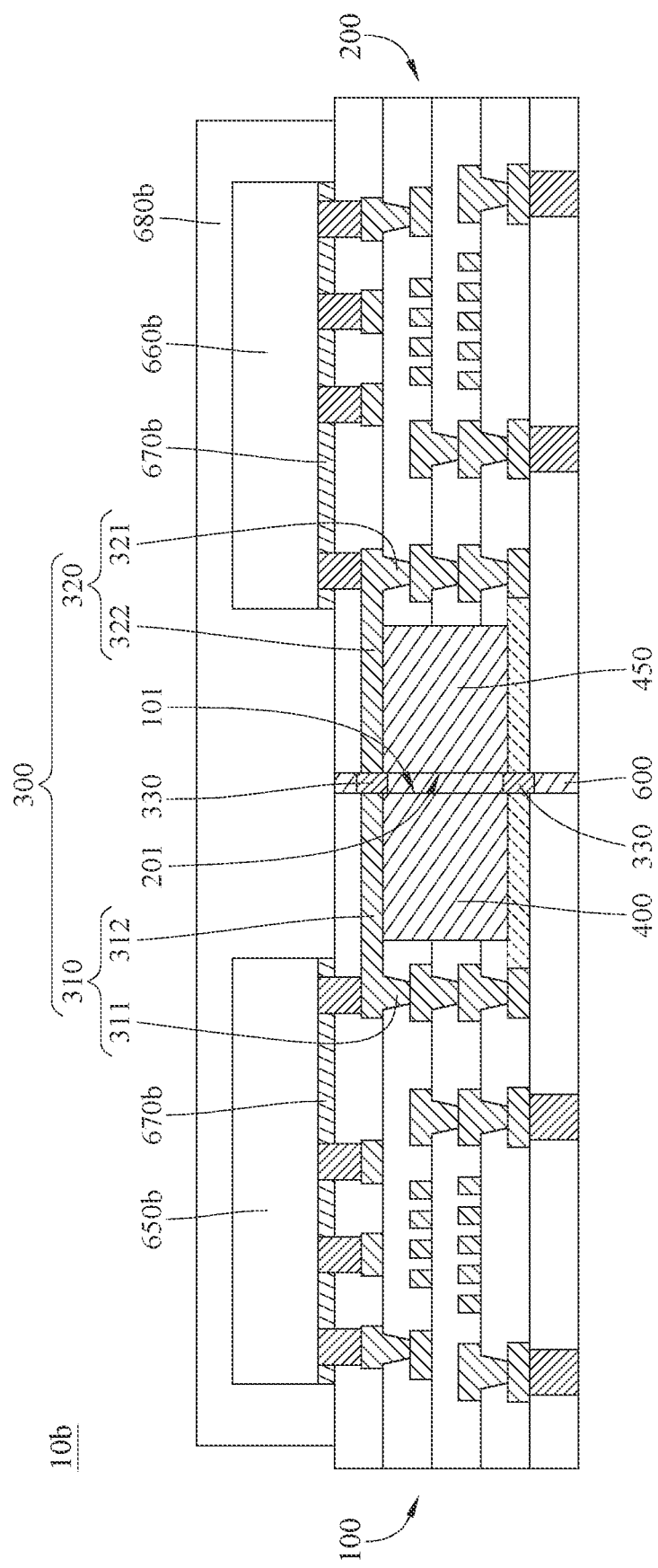
FIG. 11 is a side cross-sectional view of a circuit board structure according to a third embodiment of the disclosure.

Please refer to FIG. 11. FIG. 11 is a side cross-sectional view of a circuit board structure 10b according to a third embodiment of the disclosure. Hereinafter, only the different between the circuit board structure 10b of this embodiment and the circuit board structure 10 of the first embodiment will be described, and other similar or identical descriptions are omitted. Comparing to the circuit board structure 10 of the first embodiment, the circuit board structure 10b of this embodiment further includes a first chip 650b, a second chip 660b, a second molding compound 670b and a third molding compound 680b. The first chip 650b is electrically connected to the conductive bumps 195 of the first circuit board 100. The second chip 660b is electrically connected to the conductive bumps 295 of the second circuit board 200. The second molding compound 670b is filled in a gap between the first chip 650b and the insulating material layer 190, and in a gap between the second chip 660b and the insulating material layer 290. The third molding compound 680b is disposed on the first chip 650b, the second chip 660b and the insulating material layers 190 and 290.

Comparing to the manufacturing method of the circuit board structure 10 of the first embodiment, a manufacturing method of the circuit board structure 10b may further include a step of disposing the first chip 650b on the first circuit board 100 and disposing the second chip 660b on the second circuit board 200.

In this disclosure, the first magnetic body and the second magnetic body are not limited to respectively be in contact with the first coil pattern and the second coil pattern, and the first coil pattern is not limited to be electrically connected to the second coil pattern via the solder pads. Please refer to FIGS. 12 to 20. FIGS. 12 to 20 are side cross-sectional views of a manufacturing method of a circuit board structure 10c according to a fourth embodiment of the disclosure.

Figure 12:
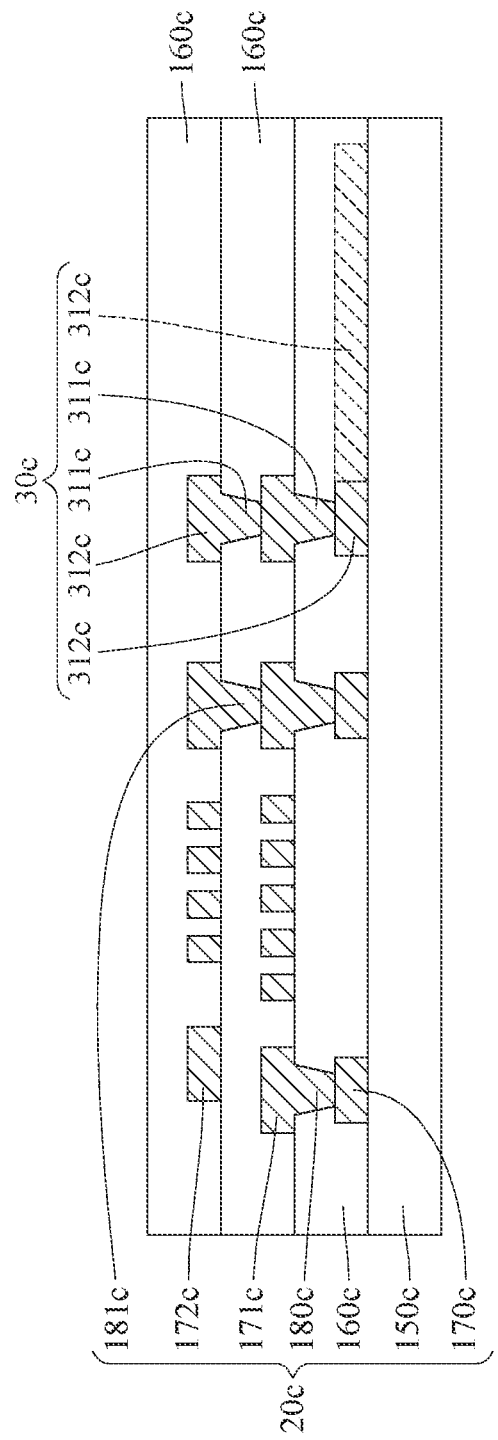
FIGS. 12 to 20 are side cross-sectional views of a manufacturing method of a circuit board structure according to a fourth embodiment of the disclosure.

Please refer to FIG. 12, an inner circuit pattern 30c is formed in a circuit substrate 20c. The circuit substrate 20c includes a substrate 150c, dielectric layers 160c, wiring layers 170c, 171c and 172c and conductive blind vias 180c and 181c. The dielectric layers 160c are disposed on the substrate 150c. The wiring layers 170c, 171c and 172c are disposed on the dielectric layers 160c or the substrate 150c, respectively. The conductive blind vias 180c and 181c are located in the dielectric layers 160c, respectively. The inner circuit pattern 30c includes vertical portions 311c and horizontal portions 312c. The vertical portions 311c of the inner circuit pattern 30c are formed together with the conductive blind vias 180c and 181c in the dielectric layers 160c. The horizontal portions 312c of the inner circuit pattern 30c are formed together with the wiring layers 170c, 171c and 172c on the dielectric layers 160c or the substrate 150c.

Figure 13:
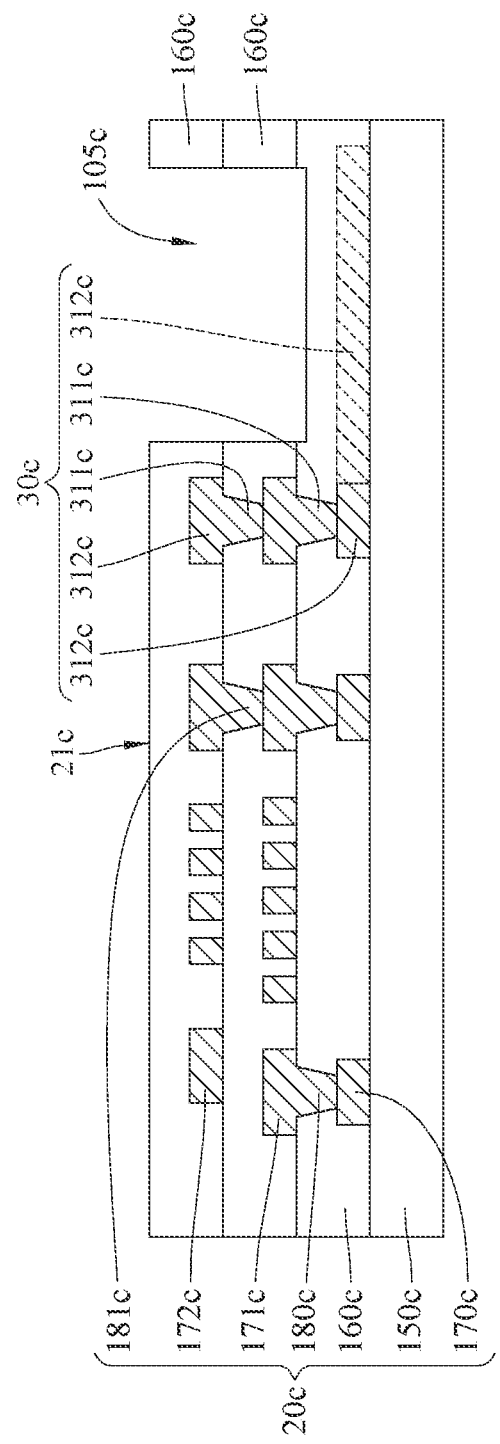

Please refer to FIG. 13, a first cavity 105c is formed in the circuit substrate 20c. The first cavity 105c is located on a top surface 21c of the circuit substrate 20c, and the horizontal portions 312c of the inner circuit pattern 30c are spaced apart from the first cavity 105c. That is, the first cavity 105c does not expose the horizontal portions 312c of the inner circuit pattern 30c.

Figure 14:
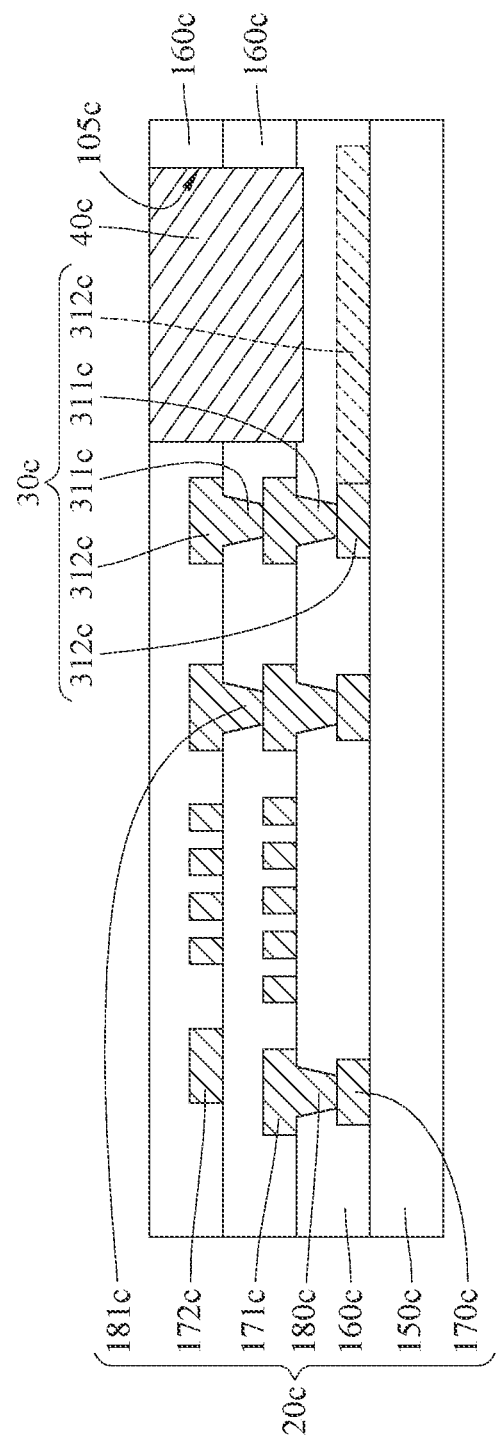

Please refer to FIG. 14, a magnetic material 40c is filled in the first cavity 105c.

Figure 15:
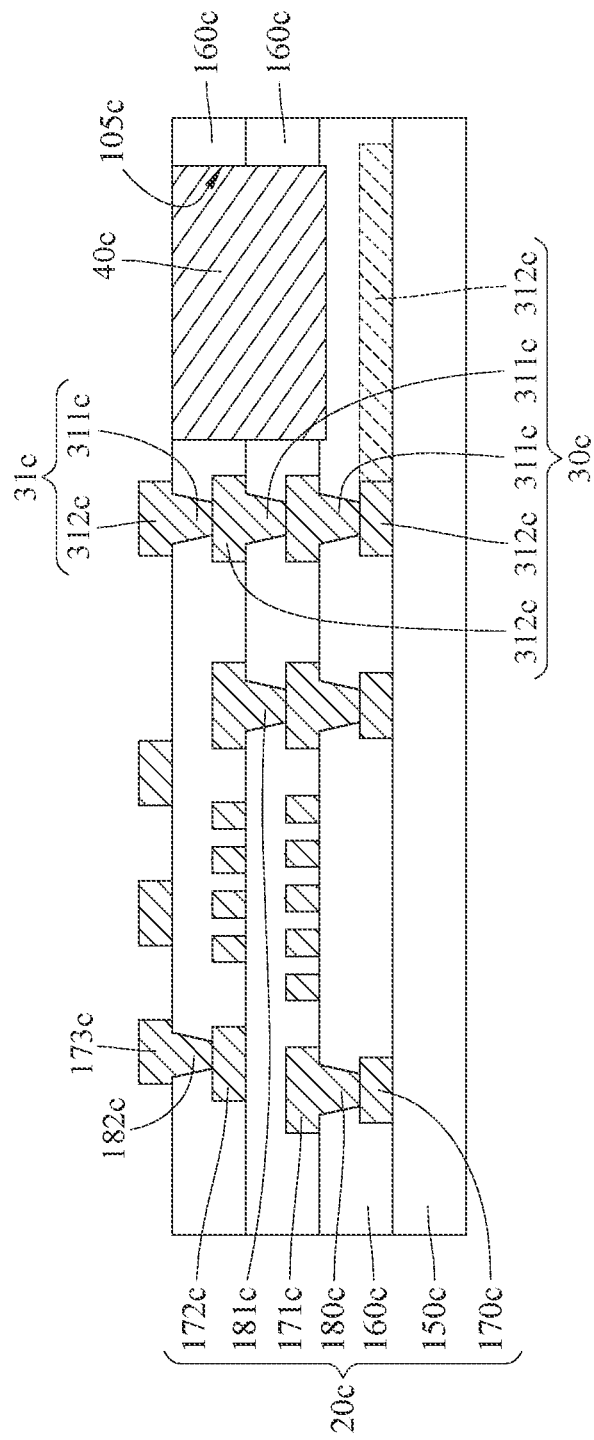

Please refer to FIG. 15, a build-up wiring layer 173c is formed on the dielectric layers 160c, a conductive blind via 182c is formed in the dielectric layer 160c, and a first outer circuit pattern 31c in formed in the circuit substrate 20c. The first outer circuit pattern 31c includes vertical portions 311c and horizontal portions 312c. The vertical portions 311c of the first outer circuit pattern 31c are formed together with the conductive blind via 182c in the dielectric layer 160c. The horizontal portions 312c of the first outer circuit pattern 31c are formed together with the build-up wiring layer 173c on the dielectric layers 160c.

Figure 16:
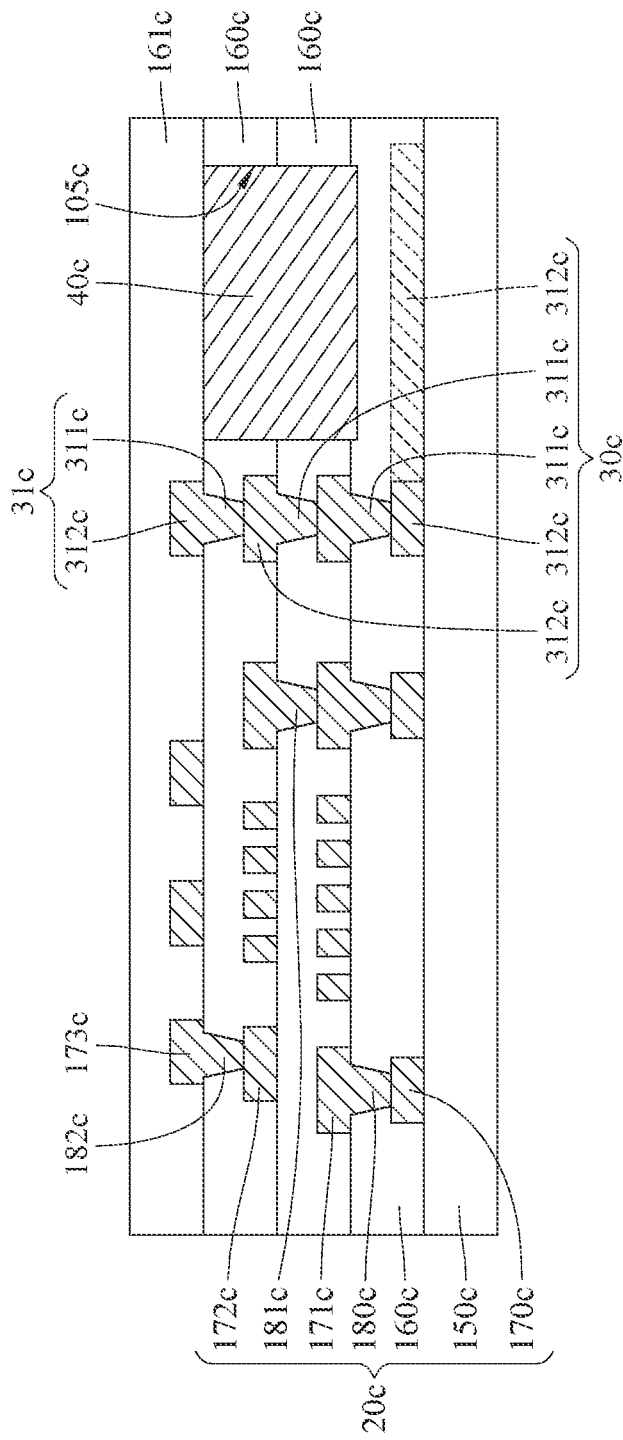

Please refer to FIG. 16, a build-up dielectric layer 161c is formed on the dielectric layers 160c, the build-up wiring layer 173c and the horizontal portions 312c of the first outer circuit pattern 31c.

Figure 17:
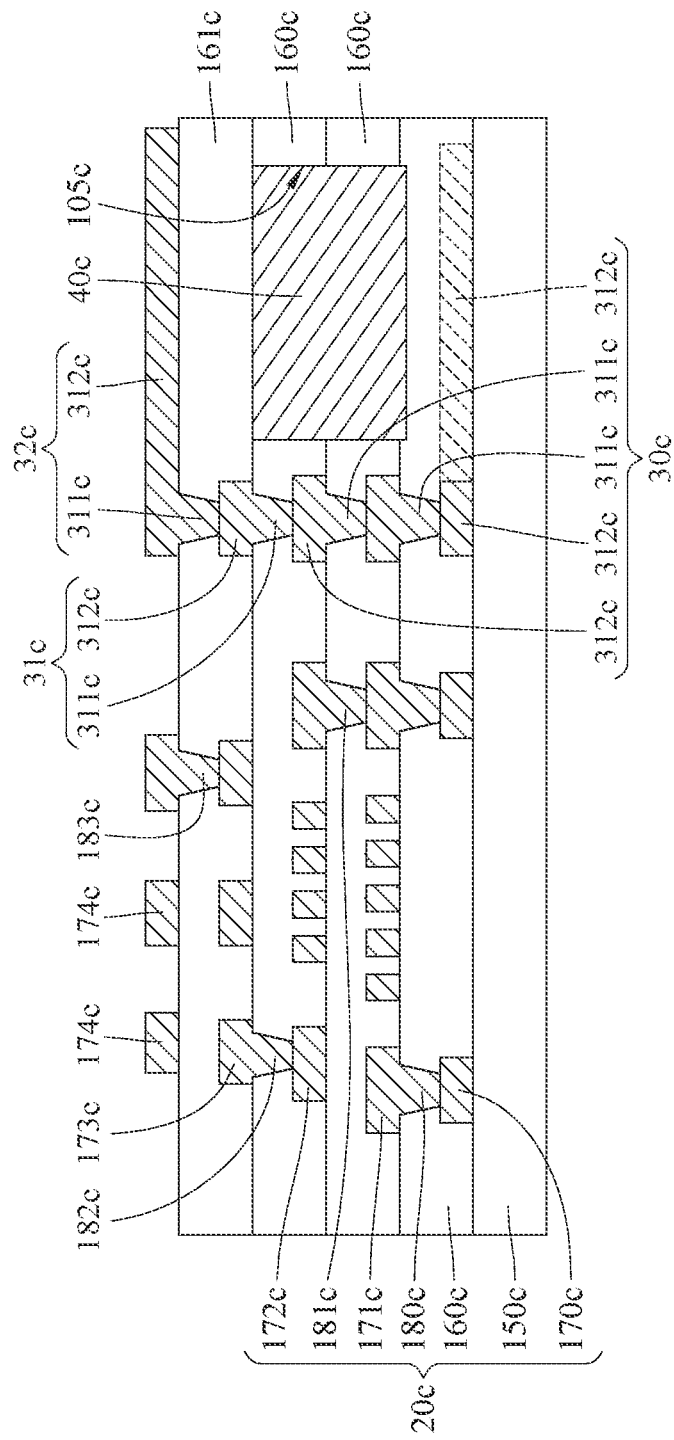

Please refer to FIG. 17, a second outer circuit pattern 32c is formed in the build-up dielectric layer 161c, bonding pads 174c are formed on the build-up dielectric layer 161c, and a conductive blind via 183c is formed in the build-up dielectric layer 161c. The second outer circuit pattern 32c includes vertical portions 311c and horizontal portions 312c. The vertical portions 311c of the second outer circuit pattern 32c are formed together with the conductive blind via 183c in the build-up dielectric layer 161c. The horizontal portions 312c of the second outer circuit pattern 32c are formed together with the bonding pads 174c on the build-up dielectric layer 161c.

Figure 18:
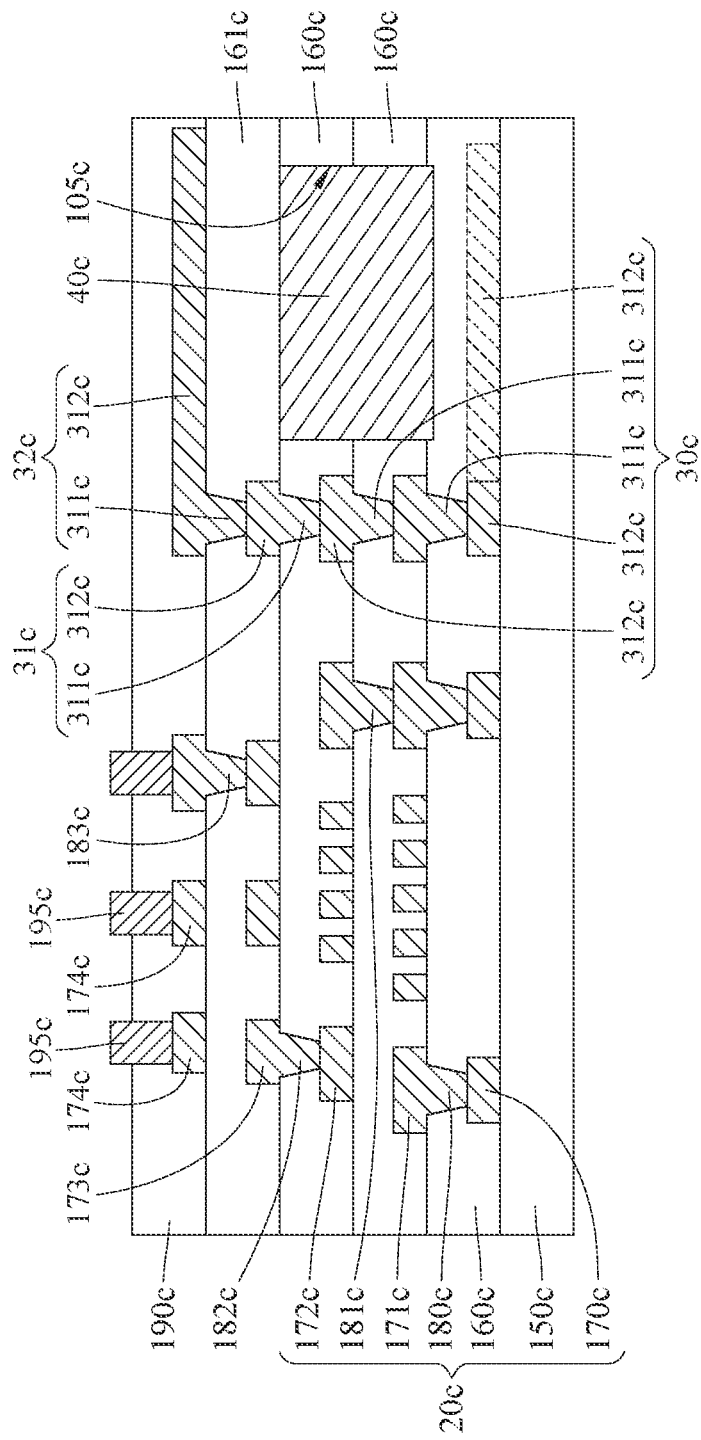

Please refer to FIG. 18, an insulating material layer 190c is formed on the build-up dielectric layer 161c, and conductive bumps 195c are formed on the bonding pads 174c.

Figure 19:
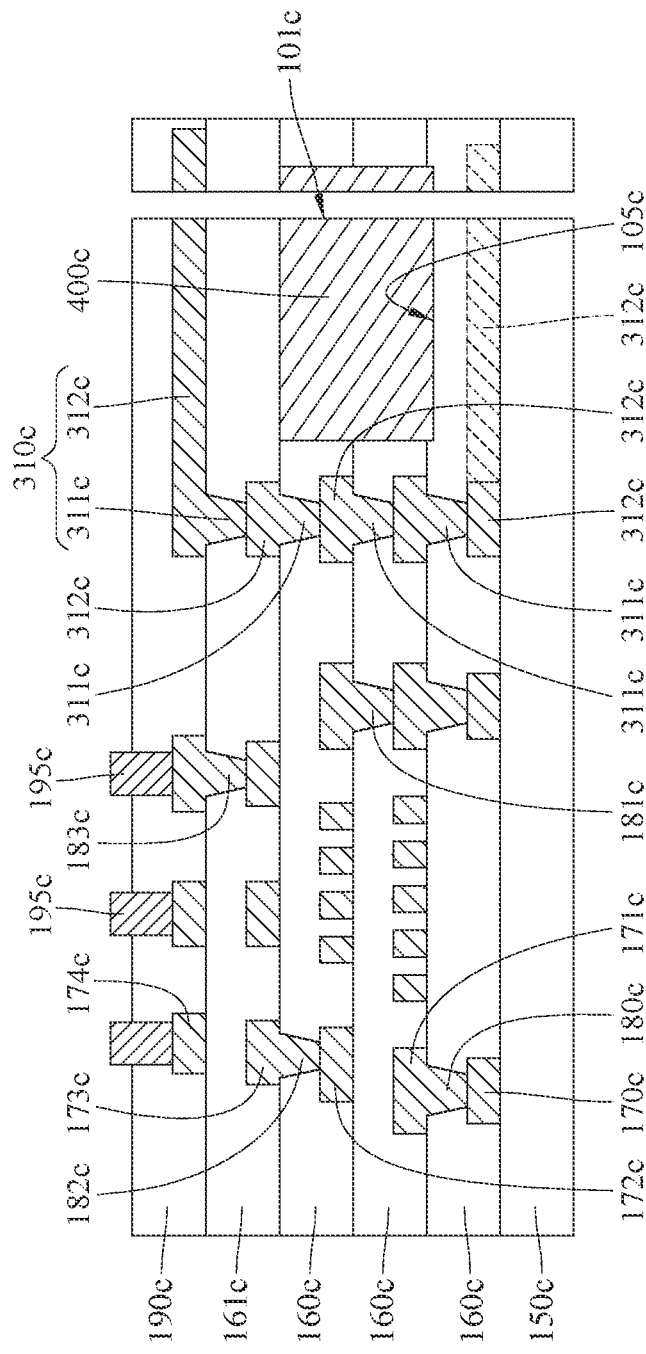

Please refer to FIGS. 18 and 19, a part of the circuit substrate 20c is cut to form a first circuit board 100c and to allow the first cavity 105c to be located on a first side surface 101c of the first circuit board 100c. Also, a part of the inner circuit pattern 30c, and a part of the second outer circuit pattern 32c are cut to form a first coil pattern 310c, and a part of the magnetic material 40c is cut to form a first magnetic body 400c. A step of forming the first coil pattern 310c and the first magnetic body 400c in the first circuit board 100c is completed so far. The first coil pattern 310c includes vertical portions 311c and horizontal portions 312c. Further, in this embodiment, the first magnetic body 400c is spaced apart from the first coil pattern 310c. Thus, in this embodiment, the effective cross-sectional area is regarded as, for example, the area of the orthogonal projection between the conductive coil 300c and the first magnetic body 400c.

Figure 20:
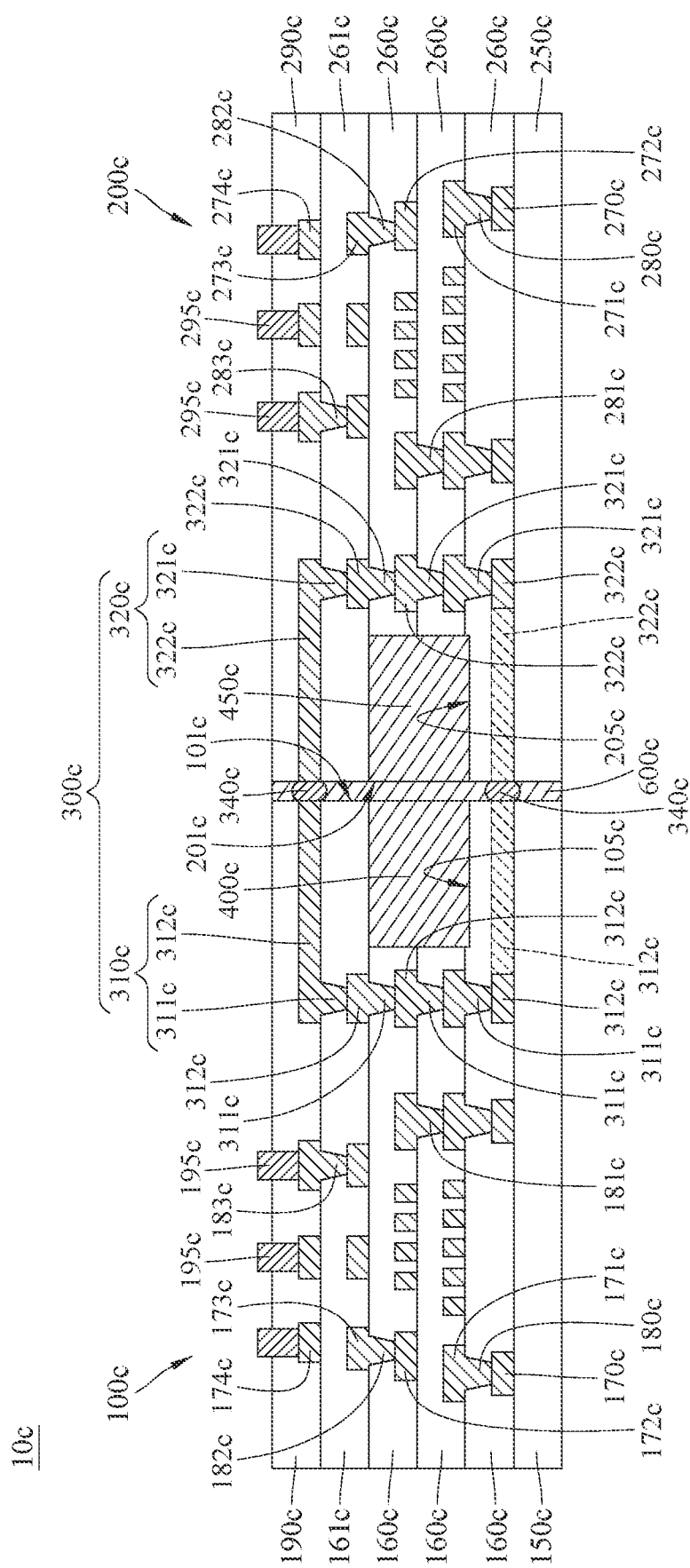

Please refer to FIG. 20, a second coil pattern 320c of the conductive coil 300c is formed in a second circuit board 200c, and a second magnetic body 450c is formed in the second circuit board 200c.

The second circuit board 200c has a second side surface 201c and a second cavity 205c. The second circuit board 200c includes a substrate 250c, dielectric layers 260c, a build-up dielectric layer 261c, wiring layers 270c, 271c and 272c, a build-up wiring layer 273c, bonding pads 274c, conductive blind vias 280c, 281c, 282c and 283c, an insulating material layer 290c and conductive bumps 295c.

The second circuit board 200c and the first circuit board 100c are similar in structure, and thus the repeated descriptions are omitted. In addition, the connection relationships between the second circuit board 200c, the second coil pattern 320c and the second magnetic body 450c are similar to that between the first circuit board 100c, the first coil pattern 310c and the first magnetic body 400c, and thus the repeated descriptions are omitted.

In addition, the first coil pattern 310c is electrically connected to the second coil pattern 320c via, for example, solder balls 340c. However, the disclosure is not limited thereto. In other embodiments, after a surface treatment is performed on the first side surface and the second side surface, the first coil pattern may be electrically connected to the second coil pattern via solder pads and solder balls.

Moreover, a molding compound 600c is filled in a gap between the first side surface 101c and the second side surface 201c. Manufacturing of the circuit board structure 10c is completed so far.

According to the circuit board structure and the manufacturing method thereof disclosed by above embodiments, the conductive coil is in a spiral shape and includes the first coil pattern disposed in the first circuit board and the second coil pattern disposed in the second circuit board. That is, the present disclosure respectively forms multiple coil patterns in multiple circuit boards to configure the conductive coil, thereby preventing the conductive coil from occupying significant amount of space in a single circuit board. Accordingly, the space utilization of each of the first circuit board and the second circuit board is improved, and the miniaturization of each of the first circuit board and the second circuit board is facilitated.

Further, the conductive coil surrounds at least a part of the first magnetic body. Thus, the first magnetic body can enhance the inductance effect generated by the conductive coil. Also, the first magnetic body is filled in the first cavity located on the first side surface. Thus, the first magnetic body can have large filling volume and large effective cross-sectional area, and the conductive coil can have more turns, thereby further enhancing the inductance effect generated by the conductive coil.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A circuit board structure, comprising:
a first circuit board, having a first side surface and a first cavity located on the first side surface;
a second circuit board, having a second side surface facing the first side surface and being spaced apart from the first side surface;
a conductive coil, in a spiral shape and comprising a first coil pattern and a second coil pattern, wherein the first coil pattern is disposed in the first circuit board, the second coil pattern is disposed in the second circuit board, and the first coil pattern is electrically connected to the second coil pattern;
a first magnetic body, filled in the first cavity of the first circuit board, the conductive coil surrounding at least a part of the first magnetic body; and
a molding compound, filled in a gap between the first side surface and the second side surface,
wherein the first side surface and the second side surface are parallel to a height direction of the first magnetic body.

2. The circuit board structure according to claim 1, further comprising a second magnetic body, wherein the second circuit board further has a second cavity, the second cavity is located on the second side surface, the second magnetic body is filled in the second cavity, and the conductive coil surrounds at least a part of the second magnetic body.

3. The circuit board structure according to claim 2, further comprising a first chip and a second chip, wherein the first chip is disposed on the first circuit board, and the second chip is disposed on the second circuit board.

4. The circuit board structure according to claim 1, wherein a size of the first circuit board is larger than a size of the second circuit board.

5. The circuit board structure according to claim 1, wherein the molding compound is magnetic.

6. The circuit board structure according to claim 1, wherein an inductance formed by the conductive coil and the first magnetic body is proportional to an effective cross-sectional area of the first magnetic body.

7. A manufacturing method of a circuit board structure, comprising:
forming a first coil pattern of a conductive coil and a first magnetic body in a first circuit board;
forming a second coil pattern of the conductive coil in a second circuit board;
electrically connecting the first coil pattern to the second coil pattern; and
filling a molding compound in a gap between a first side surface of the first circuit board and a second side surface of the second circuit board, wherein the first side surface and the second side surface are parallel to a height direction of the first magnetic body; and wherein, the conductive coil surrounds at least a part of the first magnetic body.

8. The manufacturing method of the circuit board structure according to claim 7, wherein the forming the first coil pattern and the first magnetic body in the first circuit board comprises:

forming an inner circuit pattern in a circuit substrate;
forming a first cavity in the circuit substrate;
filling a magnetic material in the first cavity;
forming an outer circuit pattern in the circuit substrate; and
cutting a part of the circuit substrate to form the first circuit board and allow the first cavity to be located on a first side surface of the first circuit board, cutting a part of the inner circuit pattern and a part of the outer circuit pattern to form the first coil pattern, and cutting a part of the magnetic material to form the first magnetic body.

9. The manufacturing method of the circuit board structure according to claim 7, further comprising forming a second magnetic body in the second circuit board before electrically connecting the first coil pattern to the second coil pattern, wherein the conductive coil surrounds at least a part of the second magnetic body.

10. The manufacturing method of the circuit board structure according to claim 7, further comprising disposing a first chip on the first circuit board and disposing a second chip on the second circuit board.

* * * * *